US012805065B2

(12) United States Patent
Newcomb et al.

(10) Patent No.: US 12,805,065 B2
(45) Date of Patent: Nov. 17, 2026

(54) PAINTED COMPONENTS AND PAINTED COMPOSITE COMPONENTS WITH MICRO-LEDS

(71) Applicant: GM GLOBAL TECHNOLOGY OPERATIONS LLC, Detroit, MI (US)

(72) Inventors: Bradley Allen Newcomb, Troy, MI (US); Julien P. Mourou, Bloomfield Hills, MI (US); Thomas S. Prevost, West Bloomfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 1014 days.

(21) Appl. No.: 17/845,333

(22) Filed: Jun. 21, 2022

(65) Prior Publication Data

US 2023/0411555 A1 Dec. 21, 2023

(51) Int. Cl.

*H10H 20/01* (2025.01)
*H10H 20/833* (2025.01)
*H10H 20/854* (2025.01)

(52) U.S. Cl.

CPC .......... *H10H 20/01* (2025.01); *H10H 20/833* (2025.01); *H10H 20/854* (2025.01)

(58) Field of Classification Search

CPC .... H10H 20/01; H10H 20/833; H10H 20/854; H10H 20/857; H10H 20/0362; H10H 20/819; H10H 20/84; H10H 20/852; H01L 25/0753

See application file for complete search history.

(56) References Cited

U.S. PATENT DOCUMENTS

| | | | | |
|---|---|---|---|---|
| 11,267,514 | B2 | 3/2022 | Aitharaju et al. | |
| 11,358,647 | B1 | 6/2022 | Newcomb et al. | |
| 11,420,683 | B2 | 8/2022 | Newcomb et al. | |
| 2014/0178662 | A1* | 6/2014 | Luo | B32B 5/12 428/220 |
| 2021/0210692 | A1* | 7/2021 | Seo | H10K 85/151 |

OTHER PUBLICATIONS

Lee et al., "Improved Light Output Power of Chemically Transferred InGaN/GaN Light-Emitting Diodes for Flexible Optoelectronic Applications", Journal of Nanomaterials 2015(5); pp. 1-6.

Bradley A. Newcomb et al., U.S. Appl. No. 17/406,023, filed Aug. 18, 2021, entitled "Transparent Composite for a Vehicle Header", 55 pages.

(Continued)

*Primary Examiner* — Raj R Gupta

(57) ABSTRACT

A painted component including micro light emitting diodes (microLEDs) comprises a transparent layer including a first side and a second side. A plurality of microLEDs are at least one of attached to or embedded in the transparent layer adjacent to the first side of the transparent layer and plurality of interconnects are made to the plurality of microLEDs. An encapsulating material encapsulates the transparent layer, the plurality of microLEDs, and the plurality of interconnections. A painted layer on the second side of the transparent layer includes at least one of etched portions and masked portions arranged over the plurality of microLEDs.

10 Claims, 5 Drawing Sheets

(56) References Cited

OTHER PUBLICATIONS

Bradley A. Newcomb et al., U.S. Appl. No. 17/406,024, filed Aug. 18, 2021, entitled "Transparent Composite for a Vehicle Roof", 53 pages.
Bradley A. Newcomb et al., U.S. Appl. No. 17/825,041, filed May 26, 2022, entitled "Structural Panoramic Windshield and Roof", 32 pages.
Bradley A. Newcomb et al., U.S. Appl. No. 17/699,696, filed Mar. 21, 2022, entitled Transparent Structural Composites with Encapsulated Micro-LEDs, 35 pages.
Bradley A. Newcomb et al., U.S. Appl. No. 17/667,260, filed Feb. 8, 2022, entitled "Heated Vehicle Header", 82 pages.
Bradley A. Newcomb et al., U.S. Appl. No. 17/584,557, filed Jan. 26, 2022, entitled "Temperature Compensated, Fiber Reinforced, Structural Composite Roof", 38 pages.
Bradley A. Newcomb et al., U.S. Appl. No. 17/141,524, filed Jan. 5, 2021, entitled "Transparent Composite Body Panels With Localized Structural Reinforcements For Motor Vehicles", 40 pages.
Bradley A. Newcomb et al., U.S. Appl. No. 17/141,478, filed Jan. 5, 2021, entitled "Laminate Composite Roof Panels With Internal Localized Structural Reinforcements For Motor Vehicles", 40 pages.
Bradley A. Newcomb et al., U.S. Appl. No. 17/226,232, filed Apr. 9, 2021, entitled "Integrated Fiber-Reinforced Polymer Vehicle Rail-and-Panel Structures And Methods Of Making The Same", 29 pages.

* cited by examiner

PAINTED COMPONENTS AND PAINTED COMPOSITE COMPONENTS WITH MICRO-LEDS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to painted components and painted composite components with micro-LEDs.

Vehicles include structural components such as hoods, decklids, doors, fenders, liftgates and other structural components and other non-structural components such as interior trim. Some of the components include simple displays or lights such as turn signals or taillight assemblies. In an effort to reduce the weight of vehicles, the components can be made using a polymer matrix with or without reinforcing fibers such as carbon fibers.

SUMMARY

A painted component including micro light emitting diodes (microLEDs) comprises a transparent layer including a first side and a second side. A plurality of microLEDs is at least one of attached to or embedded in the transparent layer adjacent to the first side of the transparent layer and plurality of interconnects are made to the plurality of microLEDs. An encapsulating material encapsulates the transparent layer, the plurality of microLEDs, and the plurality of interconnections. A painted layer on the second side of the transparent layer includes at least one of etched portions and masked portions arranged over the plurality of microLEDs.

In other features, fibers are arranged adjacent to the first side, wherein the encapsulating material encapsulates the transparent layer, the plurality of microLEDs, the interconnects, and the fibers. The fibers include reinforcing fibers selected from a group consisting of carbon fibers, glass fibers, basalt fibers, flax fibers, hemp fibers, and combinations thereof. The fibers include insulating fibers selected from a group consisting of glass fibers, basalt fibers, flax fibers, hemp fibers, pineapple fibers, cellulose fibers, and combinations thereof. The fibers include non-structural fibers selected from a group consisting of polycarbonate fibers, nylon fibers, polyethylene fibers, polypropylene fibers, and combinations thereof.

In other features, a first portion of the fibers are selected from a group consisting of glass fibers, carbon fibers, basalt fibers, flax fibers, hemp fibers, and combinations thereof, and a second portion of the fibers are selected from a group consisting of polycarbonate fibers, nylon fibers, polyethylene fibers, polypropylene fibers, and combinations thereof. The fibers include two or more different types of fibers selected from a group consisting of carbon fibers, glass fibers, basalt fibers, flax fibers, hemp fibers, pineapple fibers, cellulose fibers, polycarbonate fibers, nylon fibers, polyethylene fibers, and polypropylene fibers.

In other features, the interconnects are selected from a group consisting of conductive traces and conductive ink. A protective coating is arranged on the second side of the transparent layer.

In other features, the encapsulating material is transparent. The transparent layer is selected from a group consisting of polycarbonate, epoxy, polyurethane, polymethylmethacrylate, a polyamide, styrene-acrylonitrile, methyl methacrylate-acrylonitrile-butadiene-styrene, and styrene methyl methacrylate. The encapsulating material is selected from a group consisting of polycarbonate, epoxy, polyurethane, polymethylmethacrylate, a polyamide, styrene-acrylonitrile, methyl methacrylate-acrylonitrile-butadiene-styrene, and styrene methyl methacrylate. The plurality of microLEDs are attached to the transparent layer using optical bonding adhesive and wherein the plurality of microLEDs output light in a direction from the first side to the second side.

A method for making a painted component including micro light emitting diodes (microLEDs) includes providing a transparent layer including a first side and a second side; at least one of attaching or embedding a plurality of microLEDs in the transparent layer adjacent to the first side of the transparent layer; creating interconnects to the plurality of microLEDs; encapsulating the transparent layer, the plurality of microLEDs, and the interconnects in an encapsulating material; and one of: coating the second side of the transparent layer with a painted layer and etching portions of the painted layer arranged over the plurality of microLEDs; or masking the second side of the transparent layer over the plurality of microLEDs and coating the second side of the transparent layer with a painted layer.

In other features, the method includes arranging fibers adjacent to the first side, wherein the encapsulating material encapsulates the transparent layer, the plurality of microLEDs, the interconnects, and the fibers. The fibers include reinforcing fibers selected from a group consisting of carbon fibers, glass fibers, basalt fibers, flax fibers, hemp fibers, and combinations thereof. The fibers include insulating fibers selected from a group consisting of glass fibers, basalt fibers, flax fibers, hemp fibers, pineapple fibers, cellulose fibers, and combinations thereof. The fibers include non-structural fibers selected from a group consisting of polycarbonate fibers, nylon fibers, polyethylene fibers, polypropylene fibers, and combinations thereof.

In other features, a first portion of the fibers are selected from a group consisting of glass fibers, carbon fibers, basalt fibers, flax fibers, hemp fibers, and combinations thereof, and a second portion of the fibers are selected from a group consisting of polycarbonate fibers, nylon fibers, polyethylene fibers, polypropylene fibers, and combinations thereof. The fibers include two or more different types of fibers selected from a group consisting of carbon fibers, glass fibers, basalt fibers, flax fibers, hemp fibers, pineapple fibers, cellulose fibers, polycarbonate fibers, nylon fibers, polyethylene fibers, and polypropylene fibers.

In other features, the interconnects are selected from a group consisting of conductive traces and conductive ink. The method includes coating the second side of the transparent layer with a protective coating. The encapsulating material is transparent. The transparent layer is selected from a group consisting of polycarbonate, epoxy, polyurethane, polymethylmethacrylate, a polyamide, styrene-acrylonitrile, methyl methacrylate-acrylonitrile-butadiene-styrene, and styrene methyl methacrylate. The encapsulating material is selected from a group consisting of polycarbonate, epoxy, polyurethane, polymethylmethacrylate, a polyamide, styrene-acrylonitrile, methyl methacrylate-acrylonitrile-butadiene-styrene, and styrene methyl methacrylate.

In other features, the method includes arranging the plurality of microLEDs relative to the transparent layer to provide output light in a direction from the first side to the second side, and attaching the plurality of microLEDs to the transparent layer using optical bonding adhesive.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to painted components including a transparent layer and a plurality of microLEDs and painted composite components including a transparent layer, a plurality of microLEDs, and reinforcing fibers. The painted components and painted composite components can be used in structural, non-structural and/or semi-structural applications. While the following description includes examples where the painted components and painted composite components are used as internal or external components in vehicle applications, the painted components and painted composite components can be used in other non-vehicle applications.

In FIGS. 1-6 below, a painted component according to the present disclosure is described in further detail. The painted component includes a transparent layer made of a transparent polymer matrix (thermoplastic or thermoset). A plurality of microLEDs is attached to or embedded in the transparent layer adjacent to a first or inner surface. In some examples, the plurality of microLEDs are interconnected by traces or conductive ink to allow power and/or ground to be supplied. IN other examples, the interconnects include metallic foil, wire, a sheet or a strip that is used to provide electrical connections to the plurality of microLEDs. In some examples, the transparent layer and/or the plurality of microLEDs are fully or partially encapsulated using a transparent material. A second or outer surface of the transparent polymer matrix is painted. Painted portions of the second or outer surface of the transparent layer (located around the plurality of microLEDs) are etched to allow light to pass through. Alternately, the second or outer surface of the transparent layer is masked, painted and then the mask is removed. After etching or masking/painting, the second or outer surface is optionally coated with a clear protective coat. Additional features of the painted component are described further below.

In FIGS. 7-10 below, a painted composite component according to the present disclosure is described. The painted composite component is similar to the painted component and further includes one or more fibers arranged adjacent to the first or inner surface. The transparent layer, the plurality of microLEDs, and the fibers are encapsulated using a transparent material.

Figure 1:
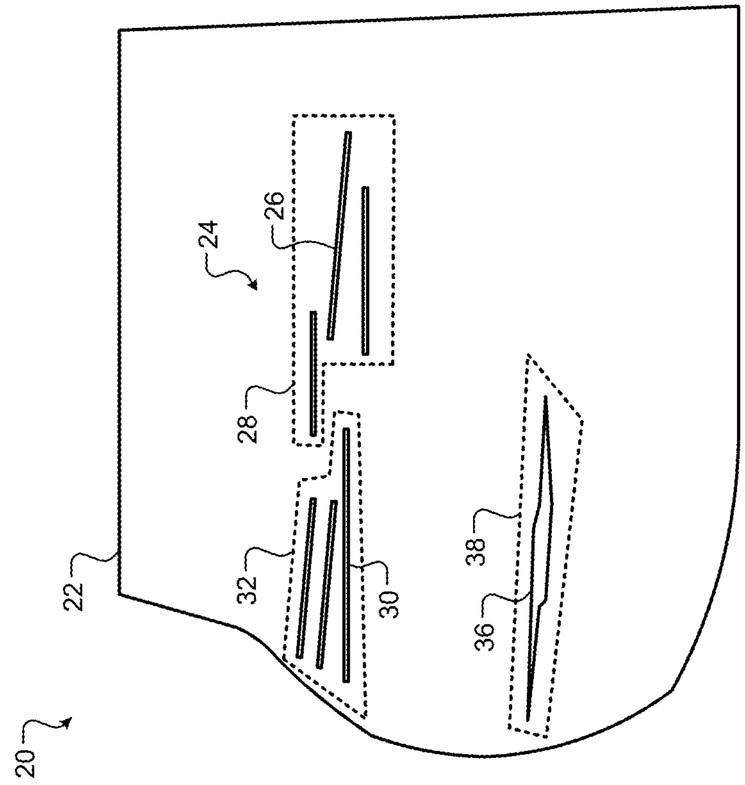
FIG. 1 is a plan view illustrating a component including a transparent layer and microLEDs according to the present disclosure.

Referring now to FIG. 1, a painted component 20 includes a transparent layer 22 having a shape corresponding to a desired component. In some examples, the transparent layer 22 is made of a transparent polymeric substrate material. A plurality of microLEDs 24 is integrated with the transparent layer 22 or attached to a first or inner surface of the transparent layer 22. The transparent layer 22 is sufficiently transparent to allow light from the plurality of microLEDs 24 to pass through to a second or outer surface of the transparent layer 22 without significant blockage.

In some examples, the plurality of microLEDs 24 is arranged in different functional groups on the painted component 20. The different functional groups may be used to provide different types of vehicle signaling. For example, a first functional group 28 may correspond to turn signals of a vehicle and includes a first plurality of microLEDs 26 arranged in a first pattern. A second functional group 32 may correspond to brake lights for the vehicle and includes a second plurality of microLEDs 30 arranged in a second pattern. A third functional group 38 corresponds to reverse lights and includes a third plurality of microLEDs 36 arranged in a third pattern. The plurality of microLEDs in each functional group can be illuminated as a group, independently, sequentially and/or in other patterns in response to one or more event. While specific implementations relating to signaling lights for vehicles is shown for purposes of illustration, the painted components can be used in other vehicular or non-vehicular applications.

The plurality of microLEDs 24 is embedded, adhered, encapsulated, fabricated, or otherwise affixed at predetermined locations of the transparent layer 22. In some examples, the plurality of microLEDs 24 is arranged adjacent to the first or inner surface of the transparent layer 22 and light output by the plurality of microLEDs 24 is directed through the transparent layer 22 towards the second or outer surface thereof.

Figure 2A:
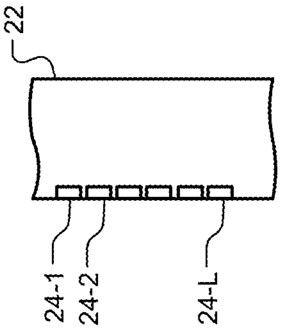
FIG. 2A is a side cross-sectional view of an example of microLEDs embedded in the transparent layer according to the present disclosure.
Figure 2B:
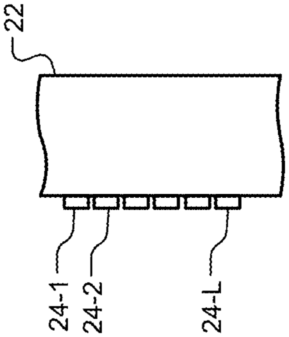
FIG. 2B is a side cross-sectional view of an example of microLEDs attached to the transparent layer according to the present disclosure.

In FIGS. 2A to 4, examples of attachment or integration of the plurality of microLEDs 24-1, 24-2, . . . , and 24-L and the transparent layer 22 is shown. In FIG. 2A, the plurality of microLEDs 24-1, 24-2, . . . , and 24-L are embedded in the transparent layer 22. In FIG. 2B, the plurality of microLEDs 24 are attached to the transparent layer 22. In some examples, the plurality of microLEDs 24 is attached using optical bonding adhesive. Interconnects such as traces or conductive ink may be used.

Figure 3:
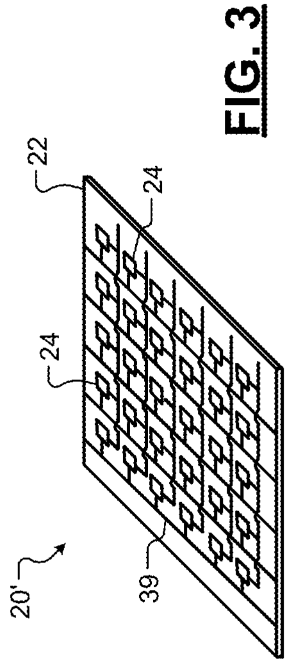
FIG. 3 is a partial perspective view of an example of microLEDs that are attached to the transparent layer and include interconnects according to the present disclosure.

In FIG. 3, a portion 20' of the painted component 20 is shown to include the transparent layer 22, the plurality of microLEDs 24 and interconnects 39 such as conductive ink or traces. In some examples, the transparent layer 22 and/or the plurality of microLEDs 24 are encapsulated in a transparent material. In some examples, the transparent over molding material includes one or more materials selected from a group consisting of a thermoset polymer, a thermoplastic polymer, an elastomer, and vitrimer.

In some examples, the plurality of microLEDs is initially manufactured on a transparent layer. Examples of methods for fabricating microLEDs on a transparent layer (such as a polymer layer) are shown in Lee et al., "Improved Light Output Power Chemically Transferred InGaN/GaN Light-Emitting Diodes for Flexible Optoelectronic Applications", Journal of Nanomaterials 2015 (5) pages 1-6, which is incorporated herein by reference in its entirety.

The microLEDs are interconnected by conductive traces and conductive ink, to allow power and/or ground to be supplied either individually to each microLED and/or collectively to groups of microLEDs that are operated at the same time. The transparent layer, the plurality of microLEDs, and the interconnects are over-molded (or encapsulated) in a transparent material to form the transparent component. Additional details can be found in commonly assigned U.S. patent application Ser. No. 17/699,696, filed on Mar. 21, 2022 and entitled "TRANSPARENT STRUCTURAL COMPOSITES WITH ENCAPSULATED MICRO-LEDS", which is incorporated herein by reference in its entirety.

Figure 5:
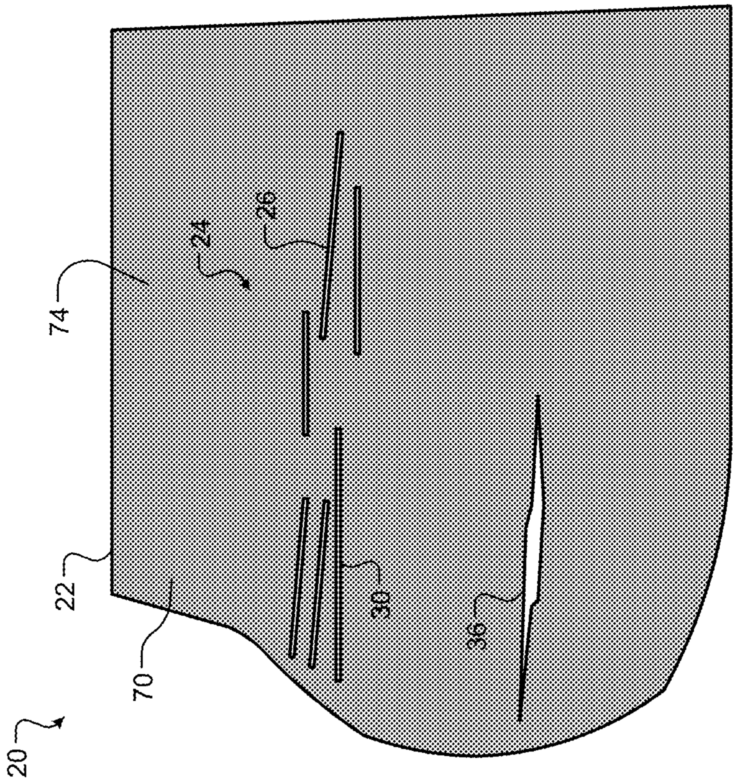
FIG. 5 is a plan view illustrating the painted component of FIG. 4 after etching or masking/painting portions of the paint layer over the plurality of microLEDs according to the present disclosure.
Figure 4:
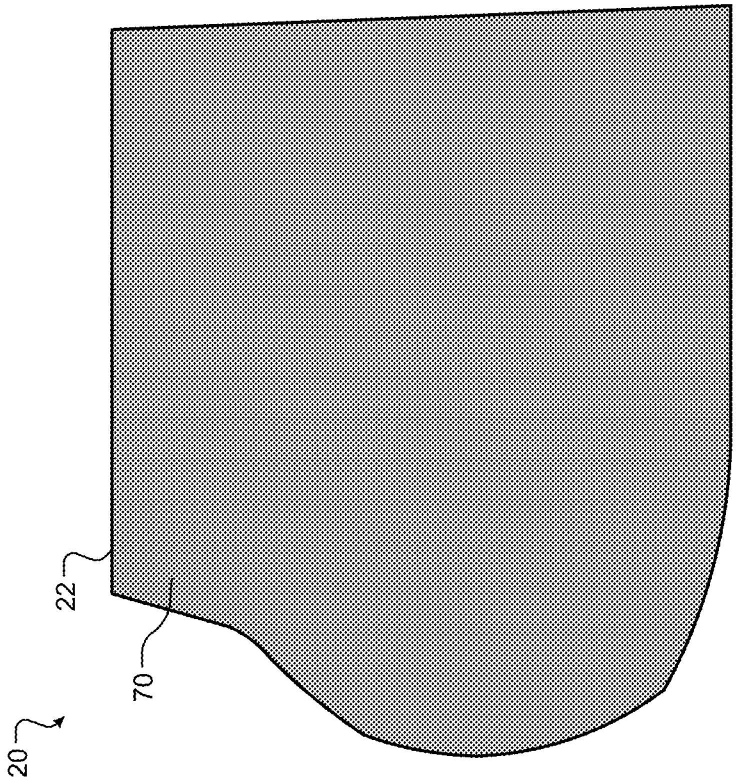
FIG. 4 is a plan view illustrating the painted component of FIG. 1 after painting according to the present disclosure.

Referring now to FIGS. 4 and 5, additional steps for manufacturing the painted component are shown. In FIG. 4, the second or outer surface of the transparent layer 22 is coated with a paint layer 70. Alternately, the second or outer surface of the transparent layer 22 is masked and painted. In some examples, the first or inner surface of the transparent layer 22 can also be coated with a paint layer.

In FIG. 5, portions of the paint layer 70 on the second or outer surface are etched in selected areas arranged over the plurality of microLEDs 24. Alternately, the mask is removed if masking/painting is performed. Removal of the paint layer 70 in these locations allows light produced by the plurality of microLEDs 24 to pass through the transparent layer 22 during operation. In some examples, laser etching is selectively performed to remove the paint layer 70. A transparent coating 74 such as a clear coat or other surface protective layer is optionally applied over the outer surface of the painted component 20.

Figure 6:
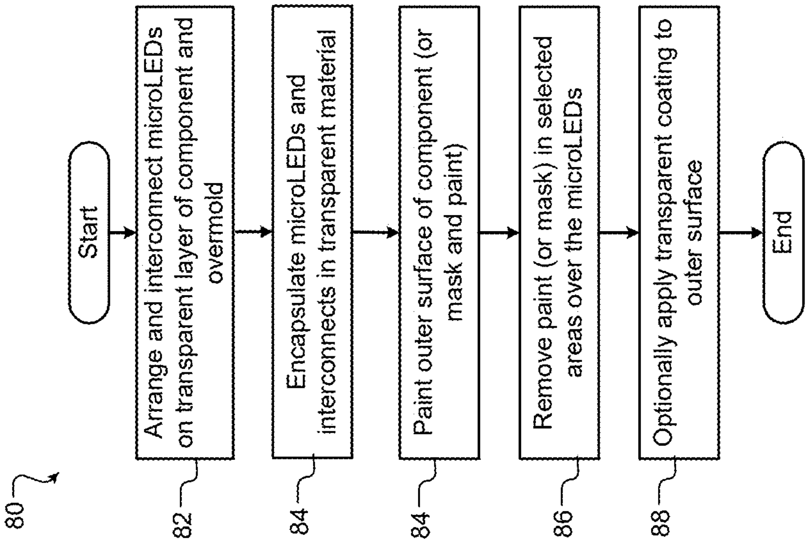
FIG. 6 is a flowchart of a method for producing a painted component with a plurality of microLEDs according to the present disclosure.

Referring now to FIG. 6, a method for manufacturing the painted component including a plurality of microLEDs is shown. At 82, a plurality of microLEDs is arranged and interconnected on a first or inner side of a transparent layer of a component. At 83, the transparent layer, the plurality of microLEDs, and the interconnects 39 are encapsulated in a transparent material. At 84, a second or outer surface of the component is painted (if masking/painting is performed, masking is performed prior to painting). At 86, portions of the paint layer are removed in selected areas over the plurality of microLEDs (or the mask is removed). Removal of the paint layer 70 (or mask) in these locations allows light produced by the plurality of microLEDs 24 to pass through the transparent layer 22 during operation of the vehicle. At 88, a transparent coating is optionally applied over the second or outer surface of the painted component.

Figure 7:
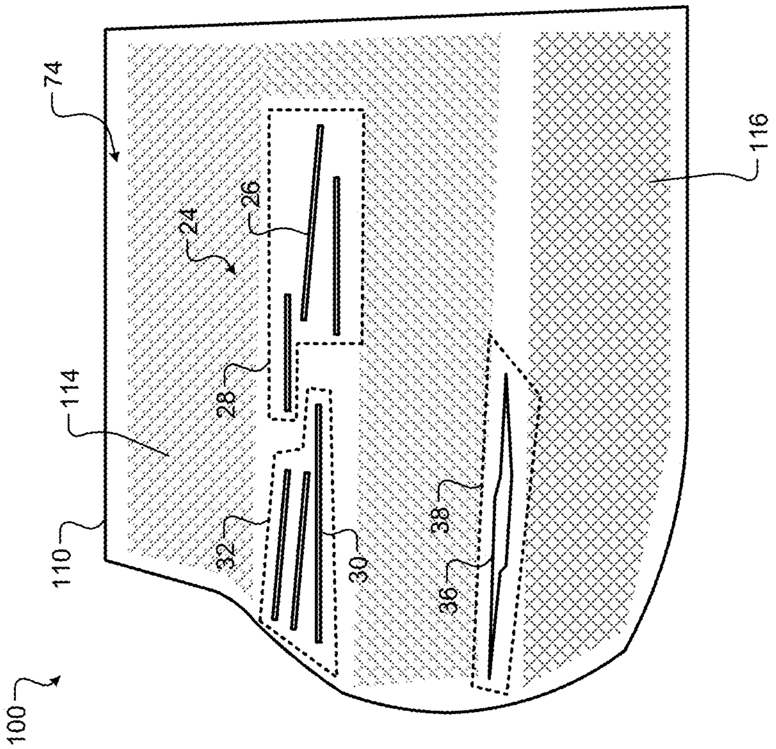
FIG. 7 is a plan view illustrating a partially-manufactured composite component including a transparent layer, microLEDs and reinforcing fibers according to the present disclosure.

Referring now to FIG. 7, a painted composite component 100 includes a transparent layer 110, a plurality of microLEDs 24 and fibers 114 and 116. In some examples, the fibers 114 and 116 are arranged along the first or inner surface of the transparent layer 110 in areas where the plurality of microLEDs 24 are not located. The transparent layer 110, the plurality of microLEDs 24 and the fibers 114 and 116 are encapsulated in a transparent material 74.

Figure 8:
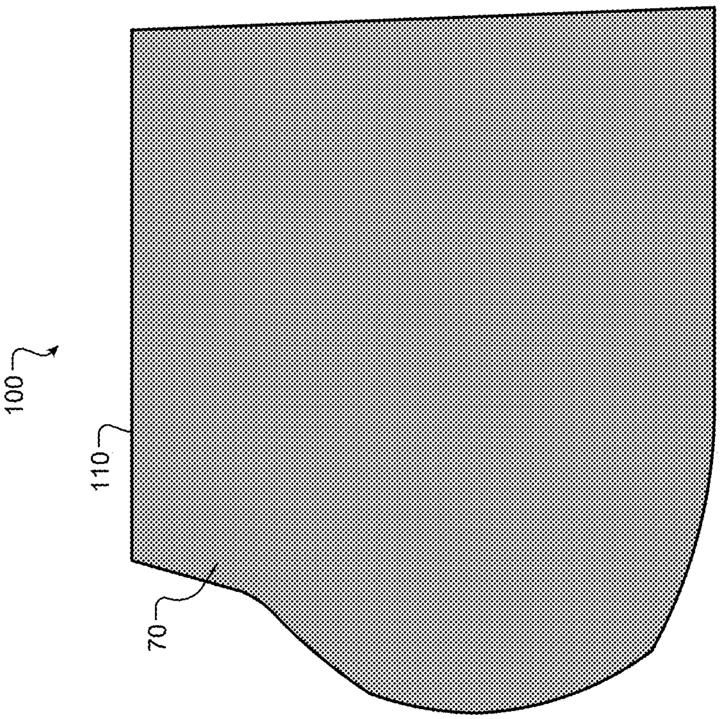
FIG. 8 is a plan view illustrating the composite component of FIG. 7 after painting according to the present disclosure.
Figure 9:
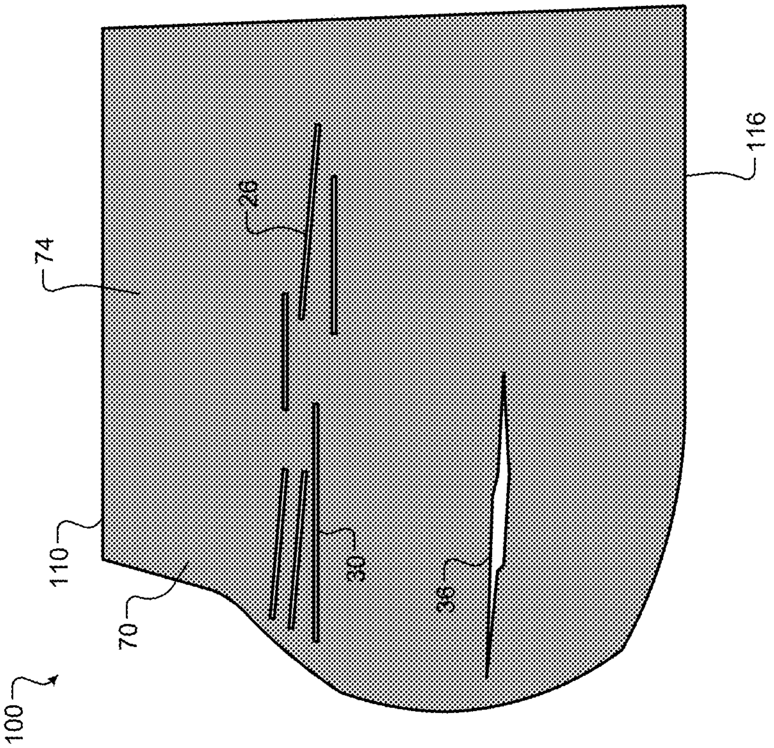
FIG. 9 is a plan view illustrating the painted composite component of FIG. 8 after etching portions of the paint layer over the plurality of microLEDs according to the present disclosure.

Referring now to FIGS. 8 and 9, additional steps for manufacturing the painted composite component layer 100 of FIG. 7 are shown. In FIG. 8, the second or outer surface of the transparent layer 110 is coated with a paint layer 70. In FIG. 9, selected portions of the paint layer 70 are removed in selected areas located over the plurality of microLEDs 24. Removal of the paint layer 70 in these locations allows light produced by the plurality of microLEDs 24 to pass through the transparent layer 110 during operation of the vehicle. A transparent coating 74 such as a clear coat or other surface protective layer is optionally applied over the outer surface of the painted composite component 100.

Figure 10:
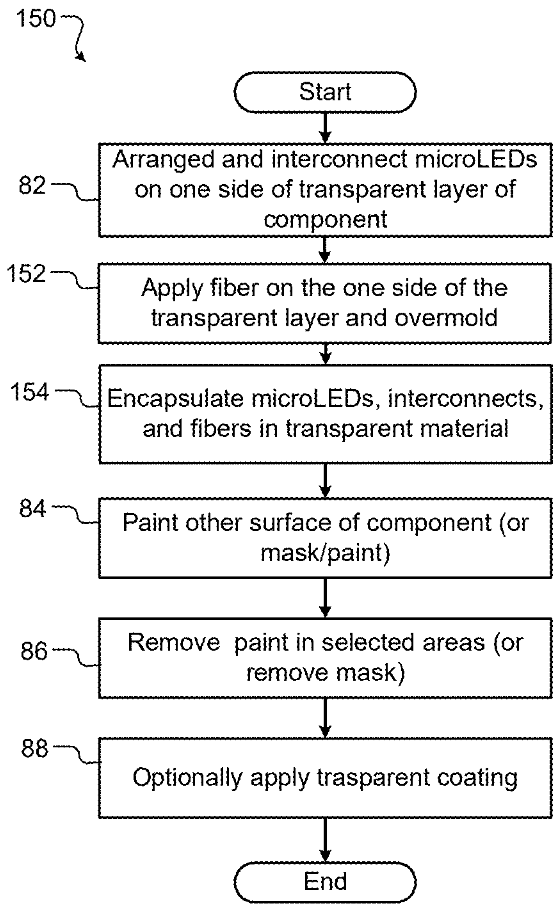
FIG. 10 is a flowchart of a method for producing a painted composite component with a plurality of microLEDs and reinforcing fibers according to the present disclosure.

Referring now to FIG. 10, a method 150 for manufacturing the painted composite component including a plurality of microLEDs is shown. At 82, a plurality of microLEDs are arranged and interconnected on one side of a transparent layer of a component. At 152, reinforcing fibers are attached to the first or inner surface of the transparent layer 22. At 154, the transparent layer, the plurality of microLEDs, the interconnects and the fibers are encapsulated in a transparent material. At 84, the second or outer surface of the component is painted (or masked and painted). At 86, portions of the paint layer are removed (or the mask is removed) in selected areas over the plurality of microLEDs. At 88, a transparent coating is optionally applied over the outer surface of the component.

In some examples, the fibers include reinforcing fibers such as carbon fiber. In other examples, the fibers includes one or more insulating fibers selected from a group consisting of glass, basalt, flax, hemp, pineapple, and cellulose. In other examples, the fibers are selected from a group consisting of carbon, glass, basalt, flax, hemp, pineapple, and cellulose. In other features, first fibers (selected from a group consisting of carbon, glass, basalt, flax, hemp, pineapple, and cellulose) are commingled with second fibers selected from a group consisting of polycarbonate, nylon, polyethylene, and polypropylene) in order to consolidate the fiber preform prior to over-molding. In some examples, the plurality of fibers have a shape selected from the group consisting of: cylindrical, flat, or both cylindrical and flat.

Suitable fiber materials may include carbon fibers (e.g., carbon black, carbon nanotubes, talc, fibers derived from polyacrylonitrile and/or pitch precursors), glass fibers (e.g., fiber glass, quartz), basalt fibers, aramid fibers (e.g., KEVLAR®, polyphenylene benzobisoxazole (PBO)), polyethylene fibers (e.g., high-strength ultra-high molecular weight (UHMW) polyethylene), polypropylene fibers (e.g., high-strength polypropylene), natural fibers (e.g., cotton, flax, cellulose, spider silk), and combinations thereof, by way of example.

In some examples, the transparent layer and/or the encapsulating transparent material includes one or more materials selected from a group consisting of polycarbonate, epoxy, polyurethane, polymethylmethacrylate, a polyamide, styrene-acrylonitrile, methyl methacrylate-acrylonitrile-butadiene-styrene, styrene methyl methacrylate, and/or other transparent polymer.

The transparent layer and/or the encapsulating transparent material may be a thermoset transparent layer or a thermoplastic transparent layer that is substantially transparent when free of fibers. In certain aspects, the transparent layer may be a thermoset transparent layer selected from the group consisting of: benzoxazine, a bis-maleimide (BMI), a cyanate ester, an epoxy, a phenolic (PF), a polyacrylate (acrylic), a polyimide (PI), an unsaturated polyester, a polyurethane (PUR), a vinyl ester, a siloxane, co-transparent layers thereof, and combinations thereof. In certain aspects, the transparent layer and/or the encapsulating transparent material may be a thermoplastic transparent layer selected from the group consisting of: polyethylenimine (PEI), polyamide-imide (PAI), polyamide (PA) (e.g., nylon 6, nylon 66, nylon 12, nylon 11, nylon 6-3-T), polyetheretherketone (PEEK), polyetherketone (PEK), polyvinyl chloride (PVC), a polyphenylene sulfide (PPS), a thermoplastic polyurethane (TPU), polypropylene (PP), polycarbonate/acrylonitrile butadiene styrene (PC/ABS), high-density polyethylene (HDPE), polyethylene terephthalate (PET), poly(methyl methacrylate) (PMMA), styrene methyl methacrylate (SMMA), methyl methacrylate acrylonitrile butadiene styrene (MABS), polycarbonate (PC), polyaryletherketone (PAEK), polyetherketoneketone (PEKK), co-transparent layers thereof, and combinations thereof.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In otherwords, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A method for making a painted component including micro light emitting diodes (microLEDs), comprising:

- providing a transparent layer including a first side and a second side;
- attaching or embedding a plurality of microLEDs in the transparent layer adjacent to the first side of the transparent layer;
- creating interconnects to the plurality of microLEDs;
- encapsulating the transparent layer, the plurality of microLEDs, and the interconnects in an encapsulating material; and
- one of:
  - coating the second side of the transparent layer encapsulated by the encapsulating material with a painted layer and etching portions of the painted layer arranged directly over the plurality of microLEDs to expose the plurality of microLEDs through the transparent layer and allow light from the plurality of microLEDs to pass through the etched portions of the painted layer; or
  - masking the second side of the transparent layer encapsulated by the encapsulating material over the plurality of microLEDs and coating the second side of the transparent layer with a painted layer, and removing the mask to expose the plurality of microLEDs through the transparent layer and allow light from the plurality of microLEDs to pass through openings in the painted layer arranged directly over the plurality of microLEDs.

2. The method of claim 1, further comprising arranging fibers adjacent to the first side, wherein the encapsulating material encapsulates the transparent layer, the plurality of microLEDs, the interconnects, and the fibers.

3. The method of claim 2, wherein the fibers include reinforcing fibers selected from a group consisting of carbon fibers, glass fibers, basalt fibers, flax fibers, hemp fibers, and combinations thereof.

4. The method of claim 2, wherein the fibers include insulating fibers selected from a group consisting of glass fibers, basalt fibers, flax fibers, hemp fibers, pineapple fibers, cellulose fibers, and combinations thereof.

5. The method of claim 2, wherein a first portion of the fibers are selected from a group consisting of glass fibers, carbon fibers, basalt fibers, flax fibers, hemp fibers, and combinations thereof, and a second portion of the fibers are selected from a group consisting of polycarbonate fibers, nylon fibers, polyethylene fibers, polypropylene fibers, and combinations thereof.

6. The method of claim 2, wherein the fibers include two or more different types of fibers selected from a group consisting of carbon fibers, glass fibers, basalt fibers, flax fibers, hemp fibers, pineapple fibers, cellulose fibers, polycarbonate fibers, nylon fibers, polyethylene fibers, and polypropylene fibers.

7. The method of claim 1, wherein the interconnects are selected from a group consisting of conductive traces and conductive ink.

8. The method of claim 1, further comprising coating the second side of the transparent layer with a protective coating.

9. The method of claim 8, wherein:

the transparent layer and the encapsulating material are transparent;

the transparent layer is selected from a group consisting of polycarbonate, epoxy, polyurethane, polymethylmethacrylate, a polyamide, styrene-acrylonitrile, methyl methacrylate-acrylonitrile-butadiene-styrene, and styrene methyl methacrylate; and the encapsulating material is selected from a group consisting of polycarbonate, epoxy, polyurethane, polymethylmethacrylate, a polyamide, styrene-acrylonitrile, methyl methacrylate-acrylonitrile-butadiene-styrene, and styrene methyl methacrylate.

10. The method of claim 1, further comprising:

arranging the plurality of microLEDs relative to the transparent layer to provide output light in a direction from the first side to the second side; and attaching the plurality of microLEDs to the transparent layer using optical bonding adhesive.

* * * * *